United States Patent [19]

Abrami et al.

[11] Patent Number: 5,001,423
[45] Date of Patent: Mar. 19, 1991

[54] DRY INTERFACE THERMAL CHUCK TEMPERATURE CONTROL SYSTEM FOR SEMICONDUCTOR WAFER TESTING

[75] Inventors: Anthony J. Abrami, Poughkeepsie; Stuart H. Bullard, Pleasant Valley; Santiago E. del Puerto, Wappingers Falls; Paul M. Gaschke, Pleasantville; Mark R. LaForce, Pleasant Valley; Paul J. Roggemann, Hopewell Junction; Kort F. Longenbach, New York City, all of N.Y.

[73] Assignee: International Business Machines Corporation, Armonk, N.Y.

[21] Appl. No.: 469,110

[22] Filed: Jan. 24, 1990

[51] Int. Cl.$^5$ .................... G01R 31/02; H05B 1/02
[52] U.S. Cl. .................... 324/158 F; 219/464; 219/483; 324/73.1
[58] Field of Search ............ 324/158 F, 73.1; 219/483, 464

[56] References Cited

U.S. PATENT DOCUMENTS 4,503,335 3/1985 Takahashi .................. 324/158 F X
4,816,647 3/1989 Payne ......................... 219/483

FOREIGN PATENT DOCUMENTS 0250064 12/1987 European Pat. Off. .

OTHER PUBLICATIONS

IBM Technical Disclosure Bulletin, vol. 31, No. 1, Jun. 1988, pp. 462–464–Electrostatic Wafer Holder for Wafer Cooling During Reactive Ion Etching.

Primary Examiner—Ernest F. Karlsen
Attorney, Agent, or Firm—John D. Crane; James R. Warnot, Jr.

[57] ABSTRACT

A wafer chuck temperature control system is disclosed for use in a semiconductor wafer testing apparatus. The wafer chuck is divided into a plurality of temperature sensor and cooling element domains corresponding to chip location regions of an overlying undiced wafer being tested. Computer scanning of the sensors determines which domain is the one harboring the heat source (chip under test) and selects the same for connection to a closed loop temperature control feedback servo. Provision also is made for introducing a helium gas interface between the wafer and the chuck by placing annular grooves in the face of the chuck through which the helium flows when the wafer is vacuum-seated against the chuck. A predetermined helium gas flow rate is maintained to preserve vacuum holddown and to optimize the thermal resistance of the wafer-chuck interface.

23 Claims, 2 Drawing Sheets

DRY INTERFACE THERMAL CHUCK TEMPERATURE CONTROL SYSTEM FOR SEMICONDUCTOR WAFER TESTING

BACKGROUND OF THE INVENTION

The present invention generally relates to semiconductor wafer testing apparatus and, more particularly, to a closed loop temperature sensing feedback system using an area-selected temperature controlled wafer chuck.

In previous practice, when wafer testing undiced semiconductor chip devices and circuitry at the then prevailing relatively low chip wattage levels (well below the 20 watt range), the required chip junction temperature of about 25 degrees Centigrade was readily maintainable. More recently, however, it has become necessary to test chip devices in undiced wafer form at wattage levels of 20 watts and beyond. Unless the thermal resistance of the wafer-chuck interface is maintained below about 1.2 degrees Centigrade per watt, it becomes very difficult, if not impossible, to obtain reliable functional test results while maintaining chip junction temperature at about 25 degrees Centigrade. Known available chuck temperature control techniques do not lend themselves to the high wattage testing of individual chips of an uncut wafer.

High wattage chips heat up significantly during wafer final test. The electrical performance of the chip depends on its operating or "junction" temperature. Performance degrades with increasing junction temperature in a non-linear manner. A certain minimum performance level is required of every chip to pass final test. In establishing this level, it had been assumed that the junction temperature held constant during test at the value prescribed in the test specification. This assumption worked reasonably well in the past, when the power levels of the chips were low (less than 5 watts.) Higher power levels make the assumption erroneous. When testing high wattage chips, there is a significant difference between the prescribed test temperature and the actual junction temperature. For example, at 20 watts of chip power, the chip can be an average of 50 degrees centigrade hotter than the chuck, the device used to support the wafer and control its temperature during final test. Worse yet, the variability of this temperature rise makes it difficult to predict the actual junction temperature, given the power input and the chuck temperature. In the example given, the junction can actually be anywhere between 25 degrees Centigrade and 75 degrees Centigrade hotter than the thermochuck. The product yield is directly affected by this uncertainty, since good chips could be testing as bad chips due simply to overheating.

The ideal approach is to actually measure the junction temperature of the device as it is being tested, and use it as a feedback control signal to the chuck temperature control system. Provided enough cooling power is available, this method would maintain the junction temperature within a narrow range centered at the prescribed temperature. Unfortunately, such a direct approach is not yet feasible in practice, and it is unlikely to become a reality in the near future. Temperature sensitive diodes would have to be placed in the chip to provide the temperature feedback, but their outputs would not be easily accessible or measurable.

The principle of operation of the state of the art in wafer temperature control is to keep constant the temperature of the chuck which supports the wafer, by means of a closed loop temperature feedback control system. The temperature of the chuck is monitored by a thermocouple and cooling power is provided by respective thermoelectric elements mounted under the plate. The control unit turns the thermoelectric element on and off as required to keep the thermocouple within 2 degrees Centigrade of the prescribed temperature. However, extensive studies have shown that with this set-up, the only useful and statistically valid junction temperature prediction that can be made is that chips dissipating under 25 watts would remain under 85 degrees Centigrade when tested on a 10 degree Centigrade chuck.

IBM (R) Technical Disclosure Bulletin, Vol. 31, No. 1, June 1988, "Electrostatic Wafer Holder for Wafer Cooling During Reactive Ion Etching" by G. Fortune and J. H. Keller discloses one technique useful in lowering the thermal resistance at the wafer-chuck (wafer-holder) interface in a reactive ion etching application. The wafer is electrostatically clamped to its holder while helium gas is applied to the backside of the wafer through annular surface grooves in the holder. However, the cited publication does not address the problem of cooling solely an area portion or domain of a wafer which is non-uniformly heated, wherein only a small surface of the wafer is heated at one time as caused by the testing of only one chip at a time among many others comprising the surface of a common undiced wafer.

Helium gas also is used in channels on the face of a wafer chuck for providing thermal contact to the back of a wafer which is mounted on the chuck as described in European patent publication 0250064, published Dec. 23, 1987, Bulletin 87/52 by George L. Coad et al. The wafer is tightly secured to the chuck by holding clamps to reduce helium leak. Again, there is no teaching of heating or cooling a wafer whose temperature is non-uniform across the face of the wafer.

SUMMARY OF THE INVENTION

One object of the invention is to control the temperature of a sector or domain of a wafer whose temperature becomes different from the remainder of the wafer.

Another object is to provide localized temperature control of a selected portion of a wafer.

A further object is to reduce the effective thermal resistance of a wafer chuck system.

Another object is to facilitate semiconductor chip testing on undiced wafers by a closed loop temperature feedback system using an area selectable temperature controlled wafer chuck.

In accordance with a preferred embodiment of the present invention, the thermal resistance of a wafer-chuck system is reduced so that heat generated at a chip location within the wafer is measured and controlled at a corresponding location in the chuck. In the limit, if the thermal resistance between wafer and chuck would approach zero, the junction temperature would approach the chuck temperature within an arbitrarily narrow range, regardless of the chip's power, since the heat would flow without resistance and therefore, without a temperature drop from the junction into the chuck. Of course, this idealized "superconductive" chuck is not achievable. It is possible, however, to approach the model to a significant degree.

Briefly, thermal resistance is reduced by injecting helium gas at low pressure into the interface between the wafer and a specially designed chuck in pressing contact with the wafer. This is accomplished by providing the top plate of the chuck with concentric helium grooves alternating between concentric vacuum grooves. The helium from a pressurized tank is allowed to leak out from the helium grooves into the vacuum grooves. The pressure of the helium is controlled to produce a predetermined flow rate for optimum results with a given chuck design. Contrary to what one may expect, arbitrarily increasing the flow of helium above the given value increases the thermal resistance across the wafer chuck interface.

The relatively low thermal conductivity of prior art chuck design created another temperature gradient within the top plate itself. The temperature was a maximum directly underneath the chip under test and decreased in an irregular fashion with the distance from that point, depending on the proximity to a cooling element in the chuck. This variation introduced an error in the temperature read by the feedback sensor also imbedded in the plate. Consequently, temperature readings for chips closest to the sensor were far more accurate than for those farther away. Such errors increase the effective thermal resistance of the chuck.

In accordance with a feature of the invention, a plurality of sensors (for example, 7) are provided in the top plate of the chuck in order to minimize the aforementioned proximity problem. The arrangement of the sensors is such as to minimize the average distance between a chip under test and a sensor. With this arrangement, each sensor covers a "domain" of 1/7th of the area of the chuck. The use of multiple sensors required a more complex control system, which uses a controlling algorithm able to detect and select for feedback input the sensor which is closest to the chip being tested. Alternatively, coordinate position information from the host computer could be used to assign the closest sensor to the chip being tested.

Finally, the thermoelectric cooling elements underneath the top plate of the chuck are arranged so that their number and locations correspond to the number and locations of the sensor domains to provide a smoother temperature profile and higher cooling capacity. In a preferred embodiment, only the element underneath the selected sensor receives feedback input. Alternatively, in a simplified embodiment, the number and locations of the elements may differ from those of the elements. In the latter case, all of the elements would be driven in unison by the feedback input from the selected sensor.

BEST MODE FOR CARRYING OUT THE INVENTION

Figure 1:
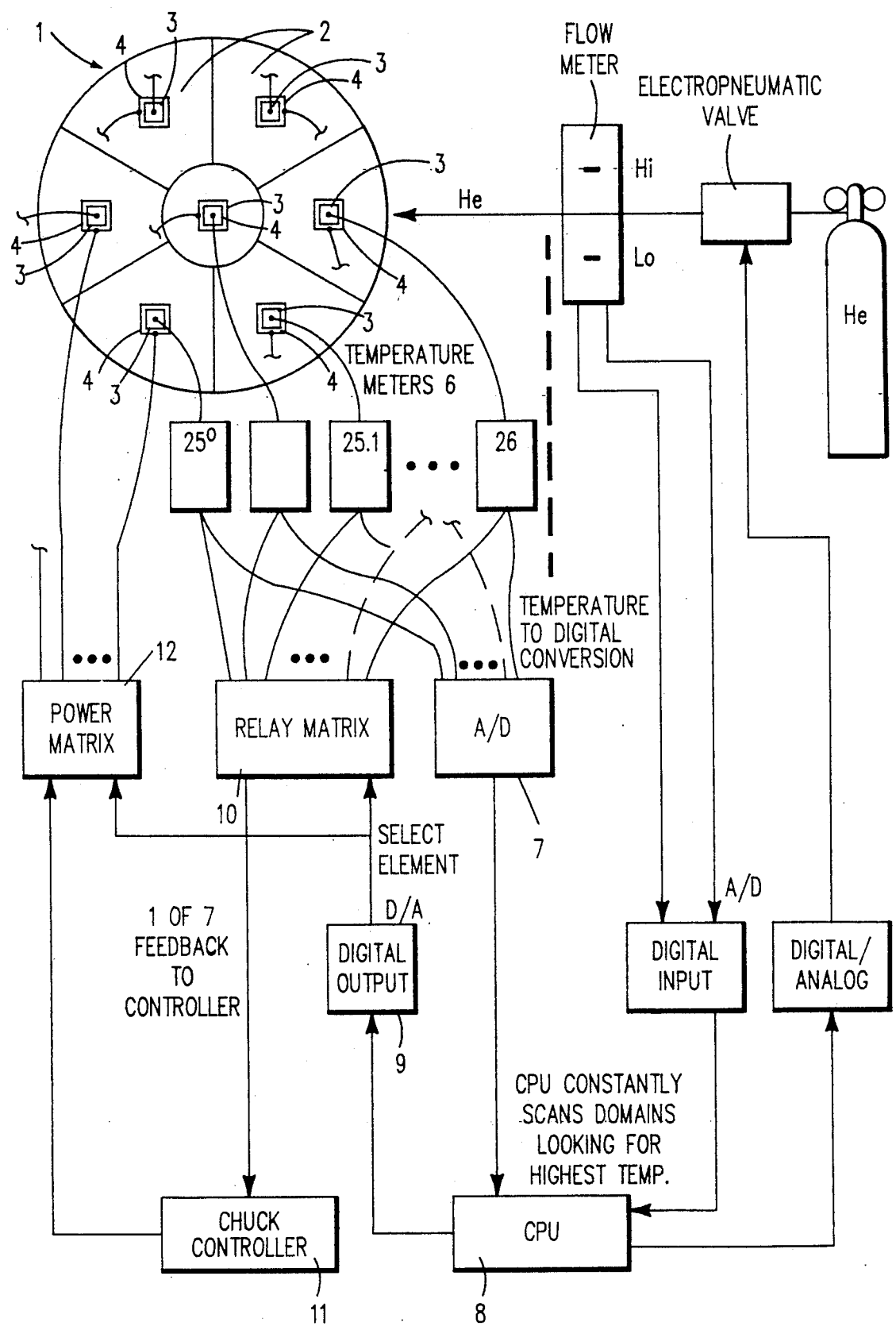
FIG. 1 is a simplified block diagram of the overall control system for selecting and activating the domain-divided coolers embedded in the chuck and for regulating the gas flow rate associated with the entire chuck in a preferred embodiment of the present invention.

In the example of FIG. 1, chuck 1 is divided into seven domains or sectors 2, each domain being equipped with a respective thermocouple sensor 3. As will be described more fully later with the aid of FIG. 2, chuck 1 comprises three adjacent layers, the uppermost of which (not shown in detail in FIG. 1) is surface-grooved in concentric circles for use as respective vacuum or helium ducts and also contains the aforementioned sensors 3.

The center layer contains thermoelectric modules 4 situated under respective sensors 3 to provide controlled cooling to a selected one of domains 2. The bottom layer of chuck 1 (not shown in FIG. 1) contains water cooling ducts to act as a heat sink.

A closed loop temperature sensing servo system is provided in FIG. 1 to cool to a predetermined temperature whichever domain 2 of chuck 1 is being heated at a given time. Such heating is the result of testing being conducted on a chip located on undiced wafer 5 of FIG. 2. Wafer 5 is held in close contact with chuck 1 by a vacuum system using the aforementioned vacuum ducts.

The servo system comprises sensors 3, temperature meters 6, analog-to-digital (A/D) converters 7, CPU 8, D/A converter 9, relay matrix 10, chuck controller 11, power matrix 12 and thermoelectric modules 4. It is contemplated that the testing of the chips of wafer 5 is to be accomplished in step fashion, one chip at a time across the face of wafer 5, with the aid of probes which are brought to bear on semiconductor device test points in accordance with conventional testing practice. Accordingly, only one chip location will be heated at a given time. The first task of the servo system is to ascertain said one location.

The heated location is determined using the technique of continuously scanning the outputs of meters 6 to note which one represents the hottest domain. This is accomplished with the aid of CPU 8 which is programmed to scan the digitized output of A/D converters 7 and select the highest value. An analog signal representing the identity of the meter 6 measuring the highest value is generated by CPU 8 and D/A converter 9 and applied to actuate power matrix 12 and relay matrix 10 accordingly. Actuated relay matrix 10 selects the highest valued meter output and applies it to the input of chuck controller 11. Actuated power matrix 12 selects the thermoelectric module 4 corresponding to the selected one of the sensors 3 and applies to it the output of chuck controller 11.

Controller 11 operates in conventional feedback servo fashion to compare the selected sensed temperature signal from matrix 10 to a predetermined value (e.g., a reference signal representing 25 degree Centigrade or ambient value) and to generate an error or command signal for application to the appropriate module 4. The error signal restores the chuck domain nearest to the heat source (chip being tested) toward said ambient value.

For some test applications, it may be sufficient to apply the error or command signal from controller 11 simultaneously to all of the modules 4. This would permit hardware simplification whereby power matrix 12 would be eliminated and the modules 4 would be wired together within the center layer of chuck 1.

Each commercially available module 4 comprises a number of thermoelectric cooling couples which are connected in series electrically but in parallel thermally. Each couple, in turn, comprises two elements of semiconductor, primarily bismuth telluride, heavily doped to create either an excess (N type) or deficiency (P type) of electrons. Heat absorbed at the cold junction is pumped to the hot junction at a rate proportional to carrier current passing through the circuit and the number of couples.

Figure 2:
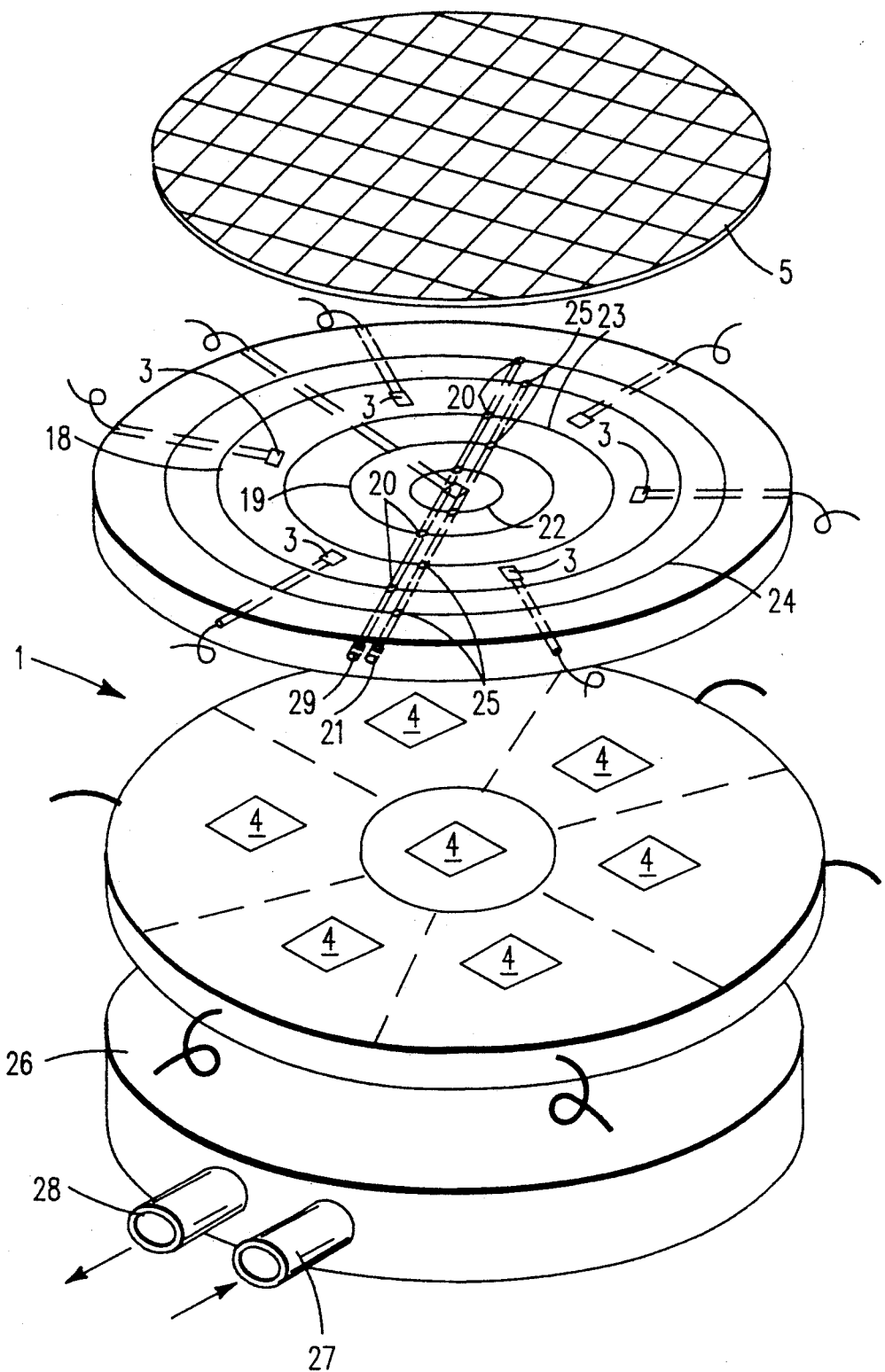
FIG. 2 is an exploded view of the three principal layers of the chuck as well as the undiced wafer under test used in the embodiment of FIG. 1.

A feature of the present invention is the maintenance of a given flow rate of helium (providing a dry, thermally conductive interface) between wafer 5 of FIG. 2 and the channeled upper surface of chuck 1 independent of changes in the locations of the test probes pressing against wafer 5 as the chip under test is changed in step fashion. As previously mentioned, it has been found that an optimum helium flow rate exists for a given chuck design. Lowering the flow rate below optimum rate increases thermal resistance as might be expected. Somewhat surprisingly, increased thermal resistance also results from flow rates higher than optimum. It is suspected that the latter happens because the extra pressure required for the higher flow rate increases the separation between the wafer and the chuck, more than offsetting any reduction in thermal resistance due to the increased density of helium.

The second constraint for helium outlet pressure is the vacuum inlet pressure, i.e., the net wafer backside pressure (vacuum minus helium) must be large enough to hold the wafer firmly in place on the chuck.

Helium flow rate control is afforded by CPU8, D/A converter 13, electropneumatic valve 14, helium source 15, flow meter 16 and A/D converter 17. Meter 16 provides an analog signal to A/D converter 17 representing existing helium flow rate in chuck 1. Converter 17 produces a corresponding digital signal for application to CPU8. CPU8 is programmed to compare the signal from converter 17 to a self-contained preset value and to provide an output signal, via D/A converter 13, to adjust valve 14 in a compensating manner.

Referring to FIG. 2, a vacuum source (not shown) is coupled to tube 29. Tube 29, in turn, is connected to grooves 18 and 19 in the upper face of chuck 1 by holes drilled from the grooved surface to buried tube 29 at locations 20. The reduced pressure present along grooves 18 and 19 holds wafer 5 in close contact with chuck 1 during chip testing. Variable space gaps between the wafer and the chuck caused by wafer warpage and surface irregularities are minimized by polishing the face of the preferably copper chuck 1 and by the introduction of helium (line 26 of FIG. 1) to buried tube 21 to act as a thermally conducting interfacing medium. Tube 21 communicates with grooves 22, 23 and 24 via holes drilled from the grooved surface at locations 25.

The individual thermoelectric modules 4 of FIGS. 1 and 2 receive respective outputs from power matrix 12 of FIG. 1. The bottom layer 26 of chuck 1 shown in FIG. 2 receives ambient temperature water at duct 27 and exhausts heated water from duct 28 to a heat exchanger (not shown).

It can be seen from the preceding specification that helium gas is evenly and consistently distributed across the backside of wafer 5 by the concentric delivery grooves in the top surface of chuck 1. This, together with the domain-based temperature feedback servo and helium flow rate control features of the preferred embodiment of the present invention contribute to a more uniform and precise control effect in reducing effective thermal resistance across the surface of the wafer during chip testing. The result is that the temperature of the chip being tested can be held more closely to a predetermined test ambient despite changes in wafer-to-chuck gap size and thermal path length as a function of the location of the chip being tested at a given time on the face of the undiced wafer. Test time also is reduced, relative to a straightforward single temperature sensor servo control of the wafer, because the individual domain sensor temperature controls afforded by the present invention allows the temperature to be maintained in the localized region of the chip being tested without significantly affecting the remainder of the chuck surface. The previously described simplified design which cools the entire chuck to one temperature unavoidably causes the area of the chuck remote from the chip being tested to experience an undesirable temperature drop. Such drop may impact the test throughput somewhat (relative to the preferred embodiment) by requiring a test delay to allow the chuck to rise to test ambient temperature when moving from one test location (chip location) to another.

Although helium is preferred as the thermally conductive gas in the disclosed semiconductor wafer test application, other gasses also are suitable, e.g., hydrogen. The invention is particularly useful in cases where heat flow on the object to be temperature-controlled varies temporarily or spatially in an unpredictable manner. Objects other than semiconductor wafers and with other than planar or round shape may be accommodated. The object may contain either a heat sink or a heat source by substituting electrical heating elements for the disclosed domain cooling elements in the latter case.

While the present invention has been disclosed in connection with the preferred embodiment thereof, it should be understood that there may be other embodiments which fall within the spirit and scope of the invention as defined by the following claims.

What is claimed is:

1. Apparatus for controlling the temperature of a particular sector of an object comprising
   a chuck for supporting said object,
   a plurality of temperature sensors spaced within said chuck,
   each sensor being placed in a domain of said chuck corresponding to a respective sector of said object,
   means for bringing said object into contact with said chuck and for firmly holding said object in close contact with said chuck;
   a plurality of temperature control modules spaced within said chuck,
   temperature control means responsive to a selected sensor for maintaining the temperature of said modules, and
   means for selecting a sensor,
   said selected sensor being connected to said modules by said temperature control means.

2. The apparatus defined in claim 1 and further including a source of a thermally conductive gas flow and
   means for introducing said gas flow between said object and said chuck when said object is brought into contact with said chuck.

3. The apparatus defined in claim 2 and further including means for maintaining the flow of said gas at a predetermined value.

4. The apparatus defined in claim 1 wherein said object is an undiced semiconductor chip-containing wafer and
   each said module is a cooling element in said chuck.

5. The apparatus defined in claim 4 and further including
   a source of a thermally conductive gas flow and means for introducing said gas flow between said object and said chuck when said object is brought into contact with said chuck.

6. The apparatus defined in claim 5 wherein said gas flow introducing means includes first annular grooves in the face of said chuck for directing the flow of said gas.

7. The apparatus defined in claim 6 wherein said means for bringing said object into contact with said chuck includes second annular grooves in the face of said chuck and means for maintaining vacuum pressure in said second grooves.

8. The apparatus defined in claim 7 wherein said first grooves are interleaved with said second grooves.

9. The apparatus defined in claim 8 and further including means for maintaining the flow of said gas at a predetermined value.

10. The apparatus defined in claim 9 wherein said chuck comprises copper.

11. The apparatus defined in claim 4 wherein said sensor selecting means comprises a computer for sampling the outputs of all said sensors and for selecting the sensor providing the signal representing the highest temperature sector of said wafer.

12. Apparatus for controlling the temperature of a particular sector of an object comprising a chuck for supporting said object,
a plurality of temperature sensors spaced within said chuck,
each sensor being placed in a domain of said chuck corresponding to a respective sector of said object,
means for bringing said object into contact with said chuck and for firmly holding said object in close contact with said chuck,
a plurality of temperature control modules spaced within said chuck,
each module being placed in a respective one of said domains of said chuck,
temperature control means responsive to a selected sensor for maintaining the temperature of a selected one of said modules, and
means for selecting a sensor and said module corresponding to said particular sector,
said selected sensor being connected to said selected modules by said temperature control means.

13. The apparatus defined in claim 12 and further including a source of a thermally conductive gas flow and means for introducing said gas flow between said object and said chuck when said object is brought into contact with said chuck.

14. The apparatus defined in claim 13 and further including means for maintaining the flow of said gas at a predetermined value.

15. The apparatus defined in claim 12 wherein said object is an undiced semiconductor chip-containing wafer and each said module is a respective cooling element in said chuck located beneath a respective sensor.

16. The apparatus defined in claim 15 and further including a source of a thermally conductive gas flow and
means for introducing said gas flow between said object and said chuck when said object is brought into contact with said chuck.

17. The apparatus defined in claim 16 wherein said gas flow introducing means includes first annular grooves in the face of said chuck for directing the flow of said gas.

18. The apparatus defined in claim 17 wherein said means for bringing said object into contact with said chuck includes second annular grooves in the face of said chuck and means for maintaining vacuum pressure in said second grooves.

19. The apparatus defined in claim 18 wherein each said first groove lies between a respective pair of said second grooves.

20. The apparatus defined in claim 19 and further including means for maintaining the flow of said gas at a predetermined value.

21. The apparatus defined in claim 15 wherein said sensor selecting means comprises a computer for sampling the outputs of all said sensors and for selecting the sensor providing the signal representing the highest temperature sector of said wafer.

22. The apparatus of claim 1 wherein said temperature sensors are arranged to minimize the average distance between said sensors.

23. The apparatus of claim 12 wherein said temperature sensors are arranged to minimize the average distance between said sensors.

* * * * *